(12) United States Patent
Shumarayev et al.

(10) Patent No.: US 7,759,972 B1
(45) Date of Patent: Jul. 20, 2010

(54) INTEGRATED CIRCUIT ARCHITECTURES WITH HETEROGENEOUS HIGH-SPEED SERIAL INTERFACE CIRCUITRY

(75) Inventors: Sergey Shumarayev, Los Altos Hills, CA (US); Wilson Wong, San Francisco, CA (US); Weiqi Ding, Fremont, CA (US); Thungoc M. Tran, San Jose, CA (US); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 92 days.

(21) Appl. No.: 11/981,934

(22) Filed: Oct. 31, 2007

(51) Int. Cl.
*H01L 25/00* (2006.01)

(52) U.S. Cl. .......................... 326/41; 326/47

(58) Field of Classification Search ............. 326/37–39, 326/47, 40–46
See application file for complete search history.

(56) References Cited

U.S. PATENT DOCUMENTS

| | | | |
|---|---|---|---|
| 5,894,565 A * | 4/1999 | Furtek et al. | 326/38 |
| 5,963,048 A * | 10/1999 | Harrison et al. | 326/39 |
| 6,650,140 B2 | 11/2003 | Lee et al. | |
| 6,650,141 B2 * | 11/2003 | Agrawal et al. | 326/41 |
| 6,861,868 B1 * | 3/2005 | Agrawal et al. | 326/38 |
| 6,861,911 B2 * | 3/2005 | Hwang et al. | 331/57 |
| 6,911,841 B2 * | 6/2005 | Lee et al. | 326/38 |
| 7,062,586 B2 * | 6/2006 | Donlin et al. | 710/305 |
| 7,414,429 B1 * | 8/2008 | Kim et al. | 326/41 |
| 7,557,610 B2 * | 7/2009 | Young | 326/41 |
| 7,635,987 B1 * | 12/2009 | Agarwal | 326/39 |
| 2006/0095613 A1 * | 5/2006 | Venkata et al. | 710/62 |

* cited by examiner

*Primary Examiner*—Vibol Tan
*Assistant Examiner*—Crystal L Hammond
(74) *Attorney, Agent, or Firm*—Ropes & Gray LLP; Robert R. Jackson

(57) ABSTRACT

An integrated circuit device such as a programmable logic device ("PLD") includes a plurality of blocks of legacy circuitry. These legacy blocks leave at least one corner of the device unoccupied by such legacy circuitry. This at least one corner is used for relatively newly developed circuitry so as to simplify and speed the design of relatively new circuitry, to avoid having to significantly redesign any of the legacy circuitry to give the device the capabilities of the new circuitry, etc. The relatively newly developed circuitry may be high-speed serial data signal interface ("HSSI") circuitry that is capable of operating at serial data rates faster than any legacy HSSI circuitry on the device.

23 Claims, 2 Drawing Sheets

INTEGRATED CIRCUIT ARCHITECTURES WITH HETEROGENEOUS HIGH-SPEED SERIAL INTERFACE CIRCUITRY

BACKGROUND OF THE INVENTION

This invention relates to integrated circuits such as programmable logic devices ("PLDs"), and more particularly to the inclusion of high-speed serial interface ("HSSI") circuitry on integrated circuits.

High-speed serial data signalling has become increasingly important for transmitting data between devices (e.g., integrated circuits) in a system. The speeds at which users of such signalling want to transmit data are constantly increasing. An integrated circuit may be developed at a time when a certain maximum data rate is widely accepted. That integrated circuit may therefore be designed to support that maximum data rate. Soon thereafter, however, it may be foreseen that significantly higher maximum data rates will be needed. Moreover, these higher data rates may be technically challenging to achieve. It would therefore be desirable to have techniques that facilitate adding to an integrated circuit architecture high-speed serial interface circuitry that can support data rates higher than the data rates that can be supported by pre-existing circuitry in that architecture.

SUMMARY OF THE INVENTION

In order to facilitate inclusion of new, higher-speed serial interface circuitry in an integrated circuit that has otherwise already been developed, the new circuitry is located in one or more corners of the device architecture. This places the new and sensitive circuitry at relatively quiet locations on the device (from the standpoint of electrical disturbance from other circuitry on the device). For example, such a corner area has little or no other circuitry of the device on at least two of its four sides. Corner placement of the new circuitry may also have the advantage of reducing the area impact of adding the new circuitry because the pre-existing circuitry of the device may make little or no use of such a corner area. The new higher-speed serial interface circuitry that is added in accordance with this invention is typically able to operate at serial data rates up to a predetermined maximum that is greater than the maximum serial data rate of any other high-speed serial interface circuitry that is provided elsewhere (i.e., not in a corner) on the device.

Other high-speed serial interface circuitry (which has been previously developed and which is slower than the new higher-speed circuitry) may also be provided on the device. If such slower high-speed serial interface circuitry is provided, it may be provided in two (or more) blocks that are spaced from one another along an edge of the device (without extending into the corner areas that are at respective opposite ends of that edge). Supporting circuitry for the new higher-speed serial interface circuitry may be located in the space (or spaces) between such blocks. An example of such supporting circuitry is oscillator circuitry (e.g., tank oscillator circuitry).

The device may be a programmable logic device ("PLD"), which also includes various other kinds of circuitry that are typically provided on PLDs.

Further features of the invention, its nature and various advantages, will be more apparent from the accompanying drawings and the following detail description.

DETAILED DESCRIPTION

Although the invention is equally applicable to other types of integrated circuits such as programmable microcontrollers or programmable integrated circuits more generally, the invention will be fully understood from this specification, which refers, for the most part, to the illustrative example of programmable logic devices ("PLDs").

Figure 1:
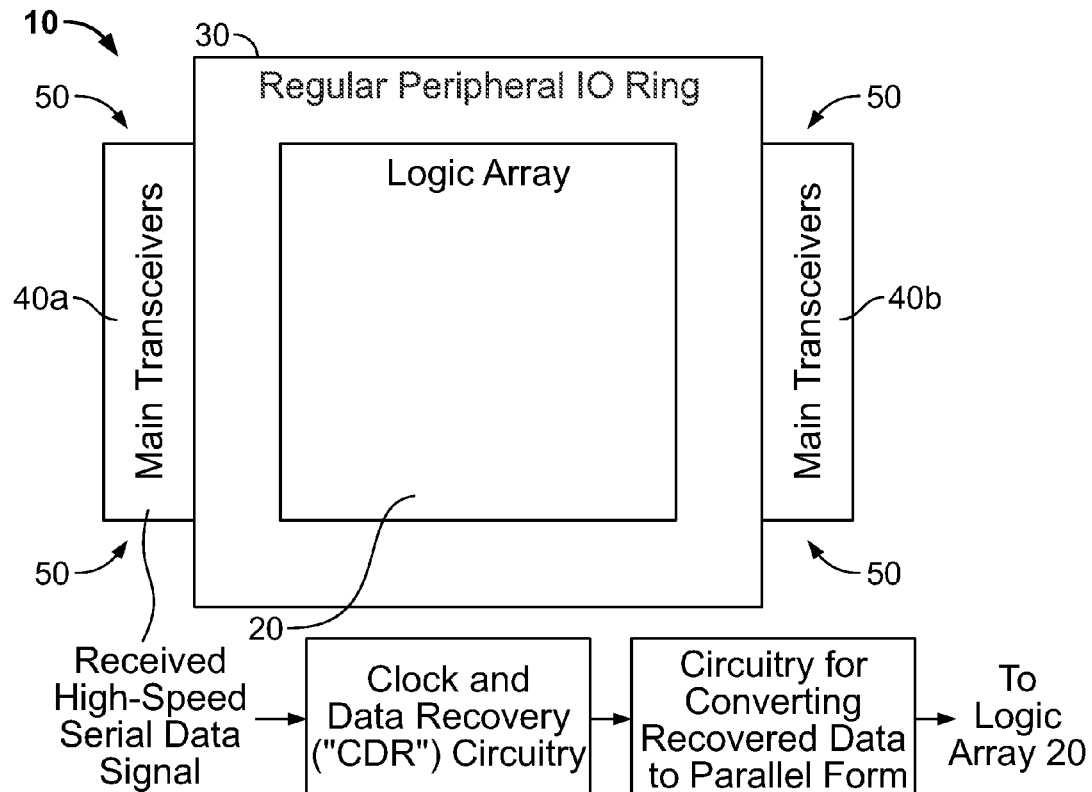
FIG. 1 is a simplified block diagram of a known architecture for an integrated circuit.

An illustrative architecture for a PLD 10 is shown in FIG. 1. This FIG. and other FIGS. that are generally like it in this disclosure show the approximate, general, physical locations of various types of circuitry on the depicted integrated circuit ("IC"). FIG. 1 shows a known architecture that includes logic array circuitry 20 in a relatively large rectangle or square in the approximate center of the IC, a ring of so-called regular peripheral input/output ("IO")' circuitry 30 surrounding logic array circuitry 20, and two strips of high-speed serial transceiver circuitry 40a and 40b along central parts of respective left and right sides of the other circuitry (outside regular peripheral IO ring circuitry 30).

Logic array circuitry 20 typically includes programmable, general-purpose logic and interconnect circuitry of the PLD. This circuitry is typically programmable to perform any of many different functions that a user of the device may want to have performed. In addition to programmable logic and programmable interconnect circuitry, logic array 20 may include other types of circuitry such as blocks of random access memory ("RAM"), blocks of digital signal processing ("DSP") circuitry, microprocessor circuitry, etc.

Regular peripheral IO ring circuitry 30 may include various kinds of input, output, and input/output circuitry for connecting logic array circuitry 20 to other circuitry that is external to device 10. For example, one or more parallel data buses may be connected to circuitry 30. Other examples include connection of clock, control, and/or programming signals to circuitry 20.

So-called main transceiver circuitry 40a/b is typically provided to allow device 10 to communicate with other external circuitry via high-speed serial data links or connections. Thus transceiver circuitry 40a/b typically includes several instances of receiver circuitry, each of which can (1) receive a high-speed serial data signal, (2) recover data from that signal, and (3) convert the recovered data to parallel form for application to logic array circuitry 20 at clock rates that are lower than the bit rate of the serial data signal (representative instances of such circuitry being shown (enlarged) for typical circuitries 40a and 150b in FIGS. 1 and 2, respectively). Such receiver circuitry (in 40a/b) may also perform certain other functions to pre-process the data for circuitry 20. Examples of such possible pre-processing include byte alignment, 8-bit/10-bit ("8B10B") decoding, inter-channel de-skewing, etc. In addition to including instances of such receiver circuitry, circuitry 40a/b also typically includes several instances of transmitter circuitry, each of which can transmit a high-speed serial data signal to circuitry external to device 10. Each such transmitter may additionally include the ability to convert data from parallel form (as supplied by logic array 20 at a relatively low parallel data clock rate) to serial form, and to perform other steps on that data (e.g., 8B10B encoding) prior to transmitting it as a high-speed serial data output signal.

In order to perform its functions, main transceiver circuitry 40a/b typically includes sensitive analog signal components that are required to operate at high speeds on and/or with high frequency signals. Examples of such components include phase-locked loop ("PLL") circuitry, delay-locked loop ("DLL") circuitry, voltage-controlled oscillator ("VCO") circuitry, phase detector ("PD") and/or phase and frequency detector ("PFD") circuitry, inductor-capacitor ("LC") tank oscillator circuitry, clock and data signal recovery ("CDR") circuitry, pre-emphasis circuitry (on the transmit side), equalization circuitry (e.g., decision feedback equalizer ("DFE") circuitry on the receiver side), and the like. Constructing such circuitry so that it can operate to reliably receive and/or transmit serial data signals at very high speed, typically also with relatively low voltage changes to indicate different binary data values, is technically challenging. This is especially so when the HSSI circuitry such as 40a/b is to be provided on an integrated circuit with many other types of circuitry (such as 20) that will be doing a lot of other digital switching and other operations at the same time that the HSSI is required to be operating reliably. As a consequence of these challenges, any given design of HSSI circuitry 40a/b is typically limited to operate at high-speed serial data rates up to no more than a maximum that can reasonably be achieved at the time the design is being developed. For example, main transceivers 40a/b of a known device 10 may be able to operate anywhere within a continuous high-speed serial data rate range from about 0.6 to about 6.5 gigabits per second ("Gbps"). Equipping device 10 to go to data rates higher than 6.5 Gbps (e.g., to a maximum of 10 Gbps) is even more challenging than attaining 6.5 Gbps. Moreover, these challenges are even greater if it is also desired to preserve the original range (0.6-6.5 Gbps in the above example, so that the device can support any serial data rate in the extended range 0.6-10 Gbps).

Figure 2:
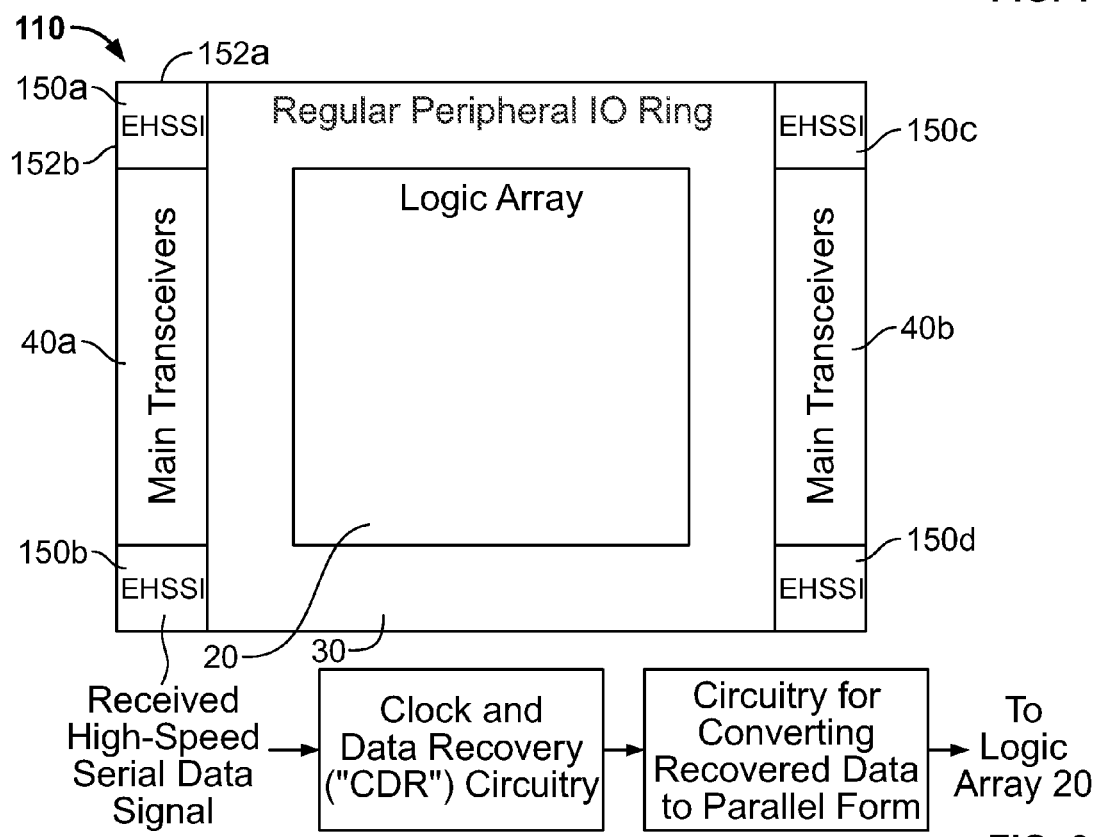
FIG. 2 is a simplified block diagram of an illustrative embodiment of an architecture for an integrated circuit in accordance with the invention.

In accordance with the present invention, to speed up the task of developing high-speed serial data signal transceiver circuitry (also known as HSSI circuitry) that can operate at higher serial data rates than already-developed HSSI circuitry, the areas in the corners 50 of a device like 10 can be used for such higher-speed transceiver circuitry. (For convenience herein, such higher-speed serial data signal transceiver circuitry may be referred to as extra-high-speed transceiver circuitry, extra-high-speed serial interface circuitry, EHSSI circuitry, extended-range transceiver circuitry, or the like.) FIG. 2 shows an illustrative embodiment of an integrated circuit 110 constructed in this way.

Elements in FIG. 2 that have reference numbers repeated from FIG. 1 can be the same or substantially the same as the identically numbered elements in FIG. 1. Thus only EHSSI circuitry 150a-d in FIG. 2 is new as compared to what is shown in FIG. 1. In the illustrative embodiment shown in FIG. 2, each block of EHSSI circuitry 150a-d is located in a respective one of the four corners of device 110. In this illustrative embodiment, EHSSI circuitry 150a-d includes several instance (or channels) of high-speed serial data signal circuitry that are able to operate at any serial data rate in the range from about 0.6 to about 10 Gbps. (This is only an example, and many variations are possible (some of which will be mentioned specifically below).)

There are at least three reasons why placement of EHSSI circuitry 150a-d in the corners of device 110 in accordance with this aspect of the invention is preferred. A first of these reasons is that this placement of the EHSSI circuitry allows development of the EHSSI circuitry feature set to be decoupled from the main transceiver channels 40a/b. The design of the main transceiver channels 40a/b can be left unaltered. Features of HSSI circuitry 40a/b that might not be needed by users of EHSSI circuitry 150 do not have to be carried over into the design of EHSSI circuitry 150. Similarly, circuitry 40 does not have to be re-designed to support new features that may be needed in EHSSI circuitry. Unaltered HSSI circuitry 40 is still available on device 110 so that device 110 can unquestionably and transparently support any use to which device 10 was historically put. (This may be referred to as supporting "legacy" applications or the like.) All of these considerations simplify and thereby facilitate and speed up the design of new EHSSI circuitry 150 (e.g., to support higher serial data rates, new feature sets, etc.).

A second reason that corner placement of EHSSI circuitry 150 as shown in FIG. 2 is preferred is that an area cost is not incurred as a result of adding EHSSI circuitry 150 to the basic architecture shown in FIG. 1. This is so because each main transceiver channel (in circuitry 40a/b) can remain unaltered. For example, these channels do not have to be increased in size (area) to support an extended operating range. Instead, all or substantially all of EHSSI circuitry 150 is assigned to otherwise empty corners 50 of the device architecture.

A third reason that corner placement of EHSSI circuitry 150 as shown in FIG. 2 is preferred is that such corners are relatively quiet places on device 110 in terms of electrical interference or noise from other circuitry on the device. For example, each such corner 50 has no noise sources on two of its four sides. (These two sides of representative corner 150a are identified by the reference numbers 152a and 152b in FIG. 2.) The relative quietness of corners 50 makes these corners good locations in which to place newly developed, possibly sensitive EHSSI circuitry 150.

As has been said, the above-mentioned 10 Gbps EHSSI circuitry 150a-d is just an example of how corners 50 may be advantageously used in accordance with the invention. Another example would be placement of so-called analog-to-digital ("A2D") transceiver circuitry in these corners as shown at 150 in FIG. 2. Still another example would be placement of even higher frequency transceivers in these corners as shown at 150 in FIG. 2. For example, such even higher frequency transceiver circuitry may be able to support serial data rates up to 15 Gbps and may therefore be referred to as 15 Gbps transceivers.

Figure 3:
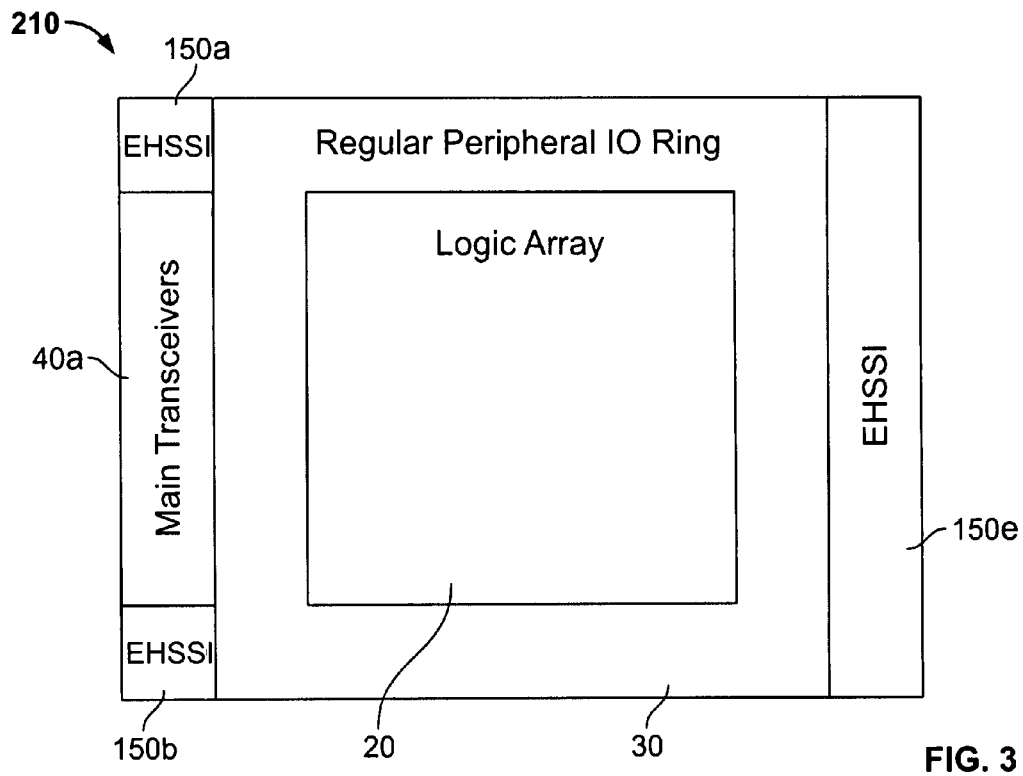
FIG. 3 is a simplified block diagram of another illustrative embodiment of an architecture for an integrated circuit in accordance with the invention.

An additional benefit of this invention is the following. After EHSSI circuitry 150 has been designed and used successfully in the architectural arrangement shown in FIG. 2, the device family that includes device 110 can be extended with relative ease (if market demand warrants it) as shown, for example, in FIG. 3. Illustrative device 210 in FIG. 3 again includes the same or substantially the same components 20, 30, 40a, 150a, and 150b from device 110 (FIG. 2). On the right-hand side ("RHS"), however, main transceiver strip 40b and EHSSI corner blocks 150c and 150d have been replaced by a strip of EHSSI circuitry 150e. Strip 150e can be several instances of the same or substantially the same circuitry that was developed for locations 150a-d in FIG. 2. In FIG. 3 this circuitry has basically been replicated along most or all of the right-hand side of device 210 in strip 150e.

A product family extension like that illustrated by FIG. 3 does not have to be limited to the right-hand side of the device. For example, the left- and right-hand sides of what is shown in FIG. 3 could be swapped, or even more extensive use could be made of EHSSI circuitry 150 (e.g., by providing strips of such EHSSI circuitry along both sides of the device, and thereby further reducing or even eliminating earlier-developed HSSI circuitry 40).

Figure 4:
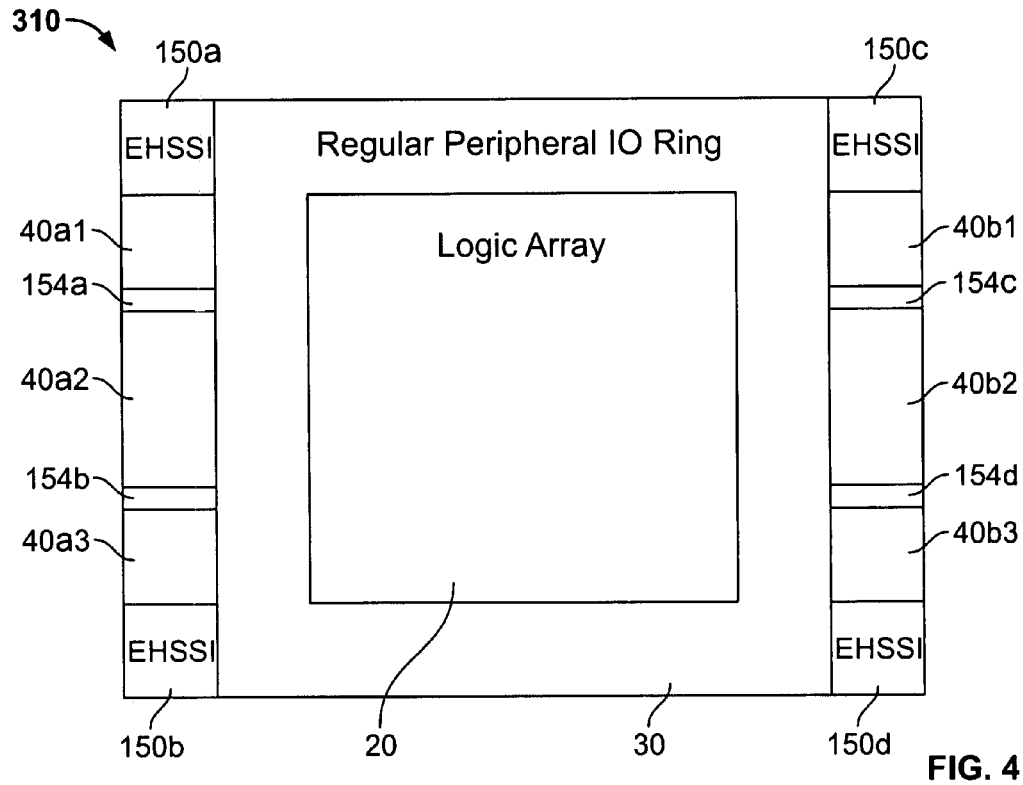
FIG. 4 is a simplified block diagram of still another illustrative embodiment of an architecture for an integrated circuit in accordance with the invention.

FIG. 4 illustrates a possible further feature of the invention. FIG. 4 is basically like FIG. 2 except for the differences that will now be described. Some circuit structures that are needed for EHSSI circuitry 150*a-d* may be advantageously placed in gaps 154*a-d* between blocks of main transceiver circuitry 40*a/b*. An example of EHSSI circuitry that may be suitable and desirable for such placement is inductor/capacitor ("LC") tank oscillator circuitry, if such circuit structures are used by EHSSI circuitry 150*a-d*. Blocks 154*a-d* in FIG. 4 therefore represent such EHSSI-related circuitry. For example, this placement of circuitry 154*a-d* may help provide low-jitter, alternative clocking paths.

Recapitulating the foregoing, an integrated circuit device (e.g., 110, 210, 310) in accordance with this invention may comprise a plurality of blocks of circuitry (e.g., 20, 30, 40) in an architecture (i.e., an overall physical organization) that leaves at least one corner (e.g., 50) of the device empty of such blocks. High-speed serial interface circuitry (e.g., 150*a*) may be disposed in said at least one corner. That high-speed serial interface circuitry is capable of operating at a serial data rate that is higher than any other high-speed serial interface circuitry that is also on the device but that is not disposed in a corner of the device. A preference is for there to be no circuitry of the device outside of the corner-located high-speed serial interface circuitry (e.g., 150*a*) on two sides (e.g., 152*a*, 152*b*) of that corner. Another preference is for the architecture to leave all four corners (e.g., 50) empty of blocks like 20, 30, and 40, and for high-speed serial interface circuitry (e.g., 150*a-d*) to be disposed in all four corners. In such a case, the high-speed serial interface circuitry in each of the corners is capable of operating at a serial data rate that is higher than any other high-speed serial interface circuitry that is also on the device but that is not in one of the corners. Also in such a case, a further preference is for there to be no circuitry of the device outside of the high-speed serial interface circuitry on two sides (e.g., 152, 152*b*) of each of the corners.

Devices in accordance with the invention as described, for example, in the preceding paragraph may also include additional high-speed serial interface circuitry (e.g., 40*a*, 40*b*) disposed along an edge of the device but not extending into either corner (e.g., 50) of the device at either end of that edge. The additional high-speed serial interface circuitry is preferably capable of operating at a maximum data rate that is less than the data rate that the high-speed serial interface circuitry (e.g., 150*a*) that is disposed in a corner of the device is capable of operating at. The additional high-speed serial interface circuitry may be disposed in two blocks (e.g., 40*a*1, 40*a*2) that are separated by a space (e.g., 154*a*) along the edge of the device. Support circuitry (e.g., 154*a*) for the high-speed serial interface circuitry (e.g., 150*a*) that is disposed in a corner of the device may be disposed in the above-mentioned space. The above-mentioned support circuitry may comprise oscillator circuitry (e.g., LC tank oscillator circuitry).

The devices mentioned in the two preceding paragraphs may comprise programmable logic devices.

Further recapitulating the foregoing, an integrated circuit device (e.g., 110, 210, 310) in accordance with the invention may include at least one block of functional circuitry (e.g., 20). The device may further include first high-speed serial interface circuitry (e.g., 150*a*) disposed in a corner (e.g., 50) of the device and being capable of operating at a serial data rate up to a first maximum serial data rate. The device may still further include second high-speed serial interface circuitry (e.g., 40*a*) that is not located in a corner of the device and that is capable of operating at a serial data rate up to a second maximum serial data rate that is less than the first maximum serial data rate. A preference is for the first maximum serial data rate to be the highest serial data rate that any high-speed serial interface circuitry on the device is capable of operating at.

In devices of the type described in the preceding paragraph, a further preference is for all high-speed serial interface circuitry (e.g., 150*a-d*) on the device that is capable of operating at the first maximum data rate to be disposed in one or more of corners (e.g., 50) of the device. A still further preference is for the second high-speed serial interface circuitry (e.g., 40*a*) to be disposed along an edge of the device without extending into either of the corners (e.g., 50) of the device that are at respective opposite ends of the edge. The second high-speed serial interface circuitry (e.g., 40*a*) that is disposed along the edge may be disposed in two blocks (e.g., 40*a*1, 40*a*2) that are spaced apart from one another along the edge. Supporting circuitry (e.g., 154*a*) for the first high-speed serial interface circuitry may be disposed between the two blocks. The above-mentioned supporting circuitry (e.g., 154*a*) may comprise oscillator circuitry (e.g., LC tank oscillator circuitry).

Again, any of the devices described in the two preceding paragraphs may comprise programmable logic devices.

Still further recapitulating the foregoing, a programmable logic device (e.g., 110, 210, 310) in accordance with the invention may include a block of logic array circuitry (e.g., 20), a ring of input/output circuitry (e.g., 30) around the block of logic array circuitry, and a strip of first high-speed serial interface circuitry (e.g., 40*a*) disposed along an edge of the device outside of the ring. This strip preferably does not extend into corner areas (e.g., 50) of the device that are at respective opposite ends of the edge. The first high-speed serial interface circuitry is capable of operating at serial data rates up to a first maximum serial data rate. The device further includes second high-speed serial interface circuitry (e.g., 150*a*) disposed in at least one of the corner areas of the device. The second high-speed serial interface circuitry is capable of operating at serial data rates up to a second maximum serial data rate that is greater than the first maximum serial data rate.

In a device of the type described in the preceding paragraph, the first high-speed serial interface circuitry may be disposed in two blocks (e.g., 40*a*1, 40*a*2) that are spaced apart from one another along the edge of the device. Supporting circuitry (e.g., 154*a*) for the second high-speed serial interface circuitry may be disposed between those two blocks. The above-mentioned supporting circuitry may comprise oscillator circuitry (e.g., LC tank oscillator circuitry).

It will be understood that the foregoing is only illustrative of the principles of the invention, and that various modifications can be made by those skilled in the art without departing from the scope and spirit of the invention. For example, the various data rates that are mentioned above are only illustrative, and any other data rates can be used instead if desired. And again, although the invention has been illustratively described for the most part herein in the context of PLDs, the invention is equally applicable to any type of integrated circuit, especially integrated circuits that are programmable (e.g., programmable microcontrollers).

What is claimed is:

1. An integrated circuit device comprising:
    a plurality of blocks of circuitry in an architecture that leaves at least one corner of the device empty of said blocks; and
    high-speed serial interface circuitry disposed in said at least one corner, said high-speed serial interface circuitry being capable of operating at a serial data rate that is higher than any other high-speed serial interface circuitry that is also on said device but that is not disposed in a corner of said device, said high-speed serial interface circuitry in said at least one corner including clock and data recovery circuitry for recovering data from a received high-speed serial data signal, and circuitry for converting the recovered data to parallel form for application to said blocks.

2. The device defined in claim 1 wherein there is no circuitry of said device outside of said high-speed serial interface circuitry on two sides of said at least one corner.

3. The device defined in claim 1 wherein said architecture leaves all four corners of said device empty of said blocks, and wherein said device further comprises:
high-speed serial interface circuitry disposed in all four of said corners, said high-speed serial interface circuitry in each of said corners being capable of operating at a serial data rate that is higher than any other high-speed serial interface circuitry that is also on said device but that is not disposed in one of said corners.

4. The device defined in claim 3 wherein there is no circuitry of said device outside of said high-speed serial interface circuitry on two sides of each of said corners.

5. The device defined in claim 3 wherein said high-speed serial interface circuitry in each of said corners includes respective clock and data recovery circuitry for recovering respective data from a respective received high-speed serial data signal, and respective circuitry for converting the respective recovered data to parallel form for application to said blocks.

6. The device defined in claim 1 further comprising:
additional high-speed serial interface circuitry disposed along an edge of said device but not extending into either corner of said device at either end of said edge, wherein said additional high-speed serial interface circuitry is capable of operating at a maximum data rate that is less than the data rate that the high-speed serial interface circuitry that is disposed in said at least one corner is capable of operating at.

7. The device defined in claim 6 wherein said additional high-speed serial interface circuitry is disposed in two blocks that are separated from one another by a space along said edge, and wherein said device further comprises:
support circuitry for the high-speed serial interface circuitry that is disposed in said at least one corner, said support circuitry being disposed in said space.

8. The device defined in claim 7 wherein said support circuitry comprises oscillator circuitry.

9. The device defined in claim 8 wherein said oscillator circuitry comprises LC tank oscillator circuitry.

10. The device defined in claim 6 wherein said additional high-speed serial interface circuitry includes additional clock and data recovery circuitry for recovering additional data from an additional received high-speed serial data signal, and additional circuitry for converting the additional recovered data to parallel form for application to said blocks.

11. The device defined in claim 1 wherein said device comprises a programmable logic device.

12. An integrated circuit device comprising:
at least one block of functional circuitry;
first high-speed serial interface circuitry disposed in a corner of said device and being capable of operating at a serial data rate up to a first maximum serial data rate; and
second high-speed serial interface circuitry disposed on said device but not in a corner of said device, said second high-speed serial interface circuitry being capable of operating at a serial data rate up to a second maximum serial data rate that is less than said first maximum serial data rate, each of said first and second high-speed serial interface circuitries including (1) respective clock and data recovery circuitry for recovering respective data from a respective received high-speed serial data signal, and (2) respective circuitry for converting the respective recovered data to parallel form for application to said block.

13. The integrated device defined in claim 12 wherein:
the first maximum serial data rate is the highest serial data that any high-speed serial interface circuitry on the device is capable of operating at.

14. The device defined in claim 13 wherein all high-speed serial interface circuitry on the device that is capable of operating at the first maximum data rate is disposed in one or more corners of the device.

15. The device defined in claim 12 wherein the second high-speed serial interface circuitry is disposed along an edge of the device without extending into either of the corners of the device that are at respective opposite ends of the edge.

16. The device defined in claim 15 wherein the second high-speed serial interface circuitry is disposed in two blocks that are spaced apart from one another along said edge, and wherein said device further comprises:
supporting circuitry for the first high-speed serial interface circuitry, said supporting circuitry being disposed between said two blocks.

17. The device defined in claim 16 wherein said supporting circuitry comprises oscillator circuitry.

18. The device defined in claim 17 wherein said oscillator circuitry comprises LC tank oscillator circuitry.

19. The device defined in claim 12 wherein said device comprises a programmable logic device.

20. An integrated circuit device comprising:
a block of circuitry;
a ring of input/output circuitry around the block of circuitry;
a strip of first high-speed serial interface circuitry disposed along an edge of said device outside of said ring, said strip not extending into corner areas of said device that are at respective opposite ends of said edge, and said first high-speed serial interface circuitry being capable of operating at serial data rates up to a first maximum serial data rate; and
second high-speed serial interface circuitry disposed in at least one of said corner areas, said second high-speed serial interface circuitry being capable of operating at serial data rates up to a second maximum serial data rate that is greater than the first maximum serial data rate, each of said first and second high-speed serial interface circuitries including (1) respective clock and data recovery circuitry for recovering respective data from a respective received high-speed serial data signal, and (2) respective circuitry for converting the respective recovered data to parallel form for application to said block.

21. The device defined in claim 20 wherein the first high-speed serial interface circuitry is disposed in two blocks that are spaced apart from one another along said edge, and wherein said device further comprises:
supporting circuitry for the second high-speed serial interface circuitry, said supporting circuitry being disposed between said two blocks.

22. The device defined in claim 21 wherein said supporting circuitry comprises oscillator circuitry.

23. The device defined in claim 22 wherein said oscillator circuitry comprises LC tank oscillator circuitry.

* * * * *